(12) United States Patent
Ruppi et al.

(10) Patent No.: US 8,343,620 B2
(45) Date of Patent: Jan. 1, 2013

(54) ALUMINA COATED GRADE

(75) Inventors: Sakari Ruppi, Fagersta (SE); Jenni Zackrisson, Fagersta (SE); Silvia Dahlund, Söderbärke (SE)

(73) Assignee: Seco Tools AB, Fagersta (SE)

( * ) Notice: Subject to any disclaimer, the term of this patent is extended or adjusted under 35 U.S.C. 154(b) by 911 days.

(21) Appl. No.: 12/021,852

(22) Filed: Jan. 29, 2008

(65) Prior Publication Data
US 2008/0187775 A1 Aug. 7, 2008

(30) Foreign Application Priority Data

Feb. 1, 2007 (SE) .................................. 0700271

(51) Int. Cl.
*B32B 9/00* (2006.01)

(52) U.S. Cl. ............ 428/216; 51/307; 51/309; 428/325; 428/336; 428/698; 428/701; 428/702

(58) Field of Classification Search .............. 51/307, 51/309; 428/216, 325, 336, 698, 701, 702
See application file for complete search history.

(56) References Cited

U.S. PATENT DOCUMENTS

| | | | |
|---|---|---|---|
| 4,277,283 A | 7/1981 | Tobioka et al. ................. 75/238 |
| 4,497,874 A | 2/1985 | Hale | |
| 4,548,786 A | 10/1985 | Yohe | |
| 4,610,931 A | 9/1986 | Nemeth et al. ..................... 428/1 |
| 4,830,930 A | 5/1989 | Taniguchi et al. ............. 428/547 |
| 5,106,674 A | 4/1992 | Okada et al. .................. 428/217 |
| 5,137,774 A | 8/1992 | Ruppi ........................... 428/216 |
| 5,451,469 A * | 9/1995 | Gustafson et al. ............. 428/552 |
| 5,654,035 A | 8/1997 | Ljungberg et al. ........... 427/255.3 |
| 5,766,782 A | 6/1998 | Ljungberg ..................... 428/698 |
| 5,786,069 A * | 7/1998 | Ljungberg et al. ............... 51/309 |
| 5,861,210 A * | 1/1999 | Lenander et al. .............. 428/336 |
| 5,863,640 A | 1/1999 | Ljungberg et al. ............ 428/216 |
| 5,945,207 A * | 8/1999 | Kutscher et al. ................. 51/307 |
| 5,980,988 A | 11/1999 | Ljungberg ................ 427/255.19 |
| 6,015,614 A * | 1/2000 | Ruppi ........................... 428/701 |
| 6,333,098 B1 * | 12/2001 | Olsson et al. ................. 428/702 |

(Continued)

FOREIGN PATENT DOCUMENTS

EP 0603143 A2 6/1994

(Continued)

OTHER PUBLICATIONS

Kim et al "Effect of partial pressure of the reactant gas on the chemical vapour deposition of alumina" Thin Solid Films Switzerland, vol. 97 No. 1, Dec. 5, 1982 p. 97-106.*

(Continued)

*Primary Examiner* — Archene Turner
(74) *Attorney, Agent, or Firm* — Young & Thompson

(57) ABSTRACT

An $\alpha$-$Al_2O_3$ coated cutting tool insert combining a cemented carbide with a binder phase enriched surface zone and a textured $\alpha$-$Al_2O_3$-layer is disclosed. The $\alpha$-$Al_2O_3$ layer has a thickness ranging from about 2-9 μm and is composed of columnar grains having a length/width ratio from about 2-12. It is characterized by a strong (104) growth texture and by low intensity of the (012), (110) and (113) diffraction peaks. The textured $\alpha$-$Al_2O_3$ is preferably deposited on an MTCVD Ti(C,N) layer having a thickness from about 2-10 μm. When the alumina layer is the uppermost layer, it may be wet-blasted to an $R_a$ value of <about 1 μm, giving the tool a black and shiny appearance.

11 Claims, 1 Drawing Sheet

U.S. PATENT DOCUMENTS

| | | | |
|---|---|---|---|
| 6,333,100 B1 * | 12/2001 | Palmqvist et al. | 428/325 |
| 6,333,103 B1 | 12/2001 | Ishii et al. | 428/325 |
| 6,337,152 B1 * | 1/2002 | Kukino et al. | 428/698 |
| 6,344,264 B1 * | 2/2002 | Lenander et al. | 428/216 |
| 6,733,874 B2 * | 5/2004 | Ueda et al. | 51/309 |
| 6,998,173 B2 * | 2/2006 | Liu et al. | 51/307 |
| 7,011,867 B2 | 3/2006 | Martensson | 427/255.34 |
| 7,094,447 B2 | 8/2006 | Ruppi | 427/419.7 |
| 7,135,221 B2 * | 11/2006 | Ruppi et al. | 428/216 |
| 7,192,637 B2 * | 3/2007 | Ruppu et al. | 428/701 |
| 7,442,432 B2 * | 10/2008 | Ruppi | 428/216 |
| 7,993,742 B2 * | 8/2011 | Ruppi | 428/698 |
| 2006/0141271 A1 | 6/2006 | Ruppi | 428/457 |
| 2006/0188748 A1 * | 8/2006 | Kjellgren et al. | 428/698 |
| 2006/0199026 A1 | 9/2006 | Ruppi | 428/472 |
| 2007/0104945 A1 | 5/2007 | Ruppi | |

FOREIGN PATENT DOCUMENTS

| | | |
|---|---|---|
| EP | 0753603 | 1/1997 |
| EP | 1026271 A1 | 8/2000 |
| EP | 1043415 A2 | 10/2000 |
| EP | 1043416 A2 | 10/2000 |
| EP | 1288335 A1 | 3/2003 |
| EP | 1528125 A2 | 5/2005 |
| EP | 1655388 | 5/2006 |
| EP | 1905870 A2 | 4/2008 |
| JP | 10-076405 * | 3/1998 |
| JP | 2005-034967 * | 2/2005 |
| JP | 2006055950 A | 3/2006 |
| WO | 9923275 A1 | 5/1999 |
| WO | 0173146 A2 | 10/2001 |
| WO | 2006/080889 | 3/2006 |

OTHER PUBLICATIONS

Ruppi, S., "Deposition, microstructure and properties of texture-controlled CVD alpha-Al2O3 coatings", International Journal of Refractory Metals and Hard Materials, 2005, pp. 306-316, vol. 23, Sweden.

Osada et al., "Wear mechanism of thermally transformed CVD AL2O3 layer", International Journal of Refractory Metals & Hard Materials 24 (2006) 387-391.

* cited by examiner

ALUMINA COATED GRADE

CROSS REFERENCE TO RELATED APPLICATIONS

This application claims priority to Swedish Patent Application 0700271-0 filed Feb. 1, 2007, the entire disclosure of which is incorporated herein by reference.

FIELD OF THE INVENTION

The present invention relates to a coated cutting tool insert designed to be used in metal machining. The substrate is cemented carbide with a tough surface zone on which a hard and wear resistant coating is deposited. The coating exhibits an excellent adhesion to the substrate covering all functional parts thereof. The coating is composed of one or more refractory layers of which at least one layer is a strongly (104) textured alpha-alumina $\alpha\text{-}Al_2O_3$).

BACKGROUND OF THE INVENTION

The control of the $\alpha\text{-}Al_2O_3$ polymorph in industrial scale was achieved in the beginning of the 1990's with commercial products based on U.S. Pat. No. 5,137,774. Later modifications of this patent have been used to deposit $\alpha\text{-}Al_2O_3$ with preferred textures. In U.S. Pat. No. 5,654,035 an alumina layer textured in the (012) direction, in U.S. Pat. No. 5,766,782 in the (104)-direction and in U.S. Pat. No. 5,980,988 in the (110) direction are disclosed. In U.S. Pat. No. 5,863,640 a preferred growth either along (012), or (104) or (110) is disclosed. U.S. Pat. No. 6,333,103 describes a modified method to control the nucleation and growth of $\alpha\text{-}Al_2O_3$ along the (10(10)) direction. U.S. Pat. No. 7,011,867 describes a method to obtain a strong (300) texture in $\alpha\text{-}Al_2O_3$ using a texture modifying agent ($ZrCl_4$). The prior-art processes discussed above use all high deposition temperatures of about 1000° C. U.S. Pat. No. 7,094,447 describes a technique to achieve a pronounced (102) texture. Enhanced deposition techniques to produce pronounced (104) and (116) textures are disclosed in US 2006/0199026 and US 2006/0141271, respectively.

Methods to produce a tough binder phase enriched zone in the upper part of a cemented carbide insert prior to coating are commonly referred to as gradient sintering. There are two types of processes, which are used to produce the binder phase enriched zone:
(i) By dissolution of the cubic phase near the surface (N-gradient). U.S. Pat. Nos. 4,277,283, 4,610,931, 4,830,930 and 5,106,674.
(ii) By controlled cooling or decarburisation (C-gradient) U.S. Pat. No. 5,106,674 and U.S. Pat. No. 4,830,930

The present invention is directed to these and other important needs, including an improved $\alpha\text{-}Al_2O_3$ coated cutting tool insert.

SUMMARY OF THE INVENTION

In one aspect, the invention is directed to cutting tool inserts comprising a cemented carbide body and a coating;
wherein the cemented carbide body comprises:
WC;
about 5-9 wt-% Co; and
about 5-11, preferably about 6.5-9.5, wt-% cubic carbides of at least one metal selected from the group consisting of groups IVb, Vb and VIb of the periodic table, preferably Ti, Nb and Ta;
wherein the cemented carbide body has an S-value of about 0.79-0.9 and a coercivity of about 9-16, preferably about 10-15, kA/m;
wherein at least one surface of the cemented carbide body comprises a binder phase enriched surface zone with a thickness of about 5-40, preferably about 10-30, μm and being essentially free from cubic carbides adjacent the coating; and
wherein the coating comprises at least one $\alpha\text{-}Al_2O_3$ layer, wherein the $\alpha\text{-}Al_2O_3$ layer is about 2-9 μm thick and wherein the $\alpha\text{-}Al_2O_3$ layer comprises columnar grains with a length/width ratio from about 2-12 whereby the $\alpha\text{-}Al_2O_3$ layer has a texture coefficient TC(104)≧about 2.0, preferably ≧about 3:
the texture coefficient TC(hkil) being defined as:

$$TC(hkil) = \frac{I(hkil)}{I_0(hkil)}\left[\frac{1}{n}\sum_{n=1}^{n}\frac{I(hkil)}{I_0(hkil)}\right]^{-1}$$

where
I(hkl)=intensity of the (hkl) reflection,
$I_0$(hkl)=standard intensity according to Joint Committee on Powder Diffraction Standards (JCPDS) card no 46-1212,
n number of reflections used in the calculation, 5,
where the (hkil) reflections used are: (012), (104), (110), (113) and (116).

The $\alpha\text{-}Al_2O_3$ phase according to the present invention consists of nucleated $\alpha\text{-}Al_2O_3$ with a strong, fully controlled (104) growth texture and is deposited on a binder phase enriched cemented carbide substrate. The $\alpha\text{-}Al_2O_3$ layer with the controlled (104) texture can be obtained within a temperature range from about 750-1000° C., which reduces the thermal stresses. This kind of alumina coated grade outperforms the prior art with random or other less developed textures. Further, increased toughness can be obtained when deposition is carried out at lower temperatures. Compared with prior-art products the $\alpha\text{-}Al_2O_3$ layer according the present invention is essentially free from transformation stresses, consists of columnar, defect free, $\alpha\text{-}Al_2O_3$ grains with low dislocation density and has improved cutting properties. It was surprisingly noted that the (104) texture according to this invention outperforms the prior-art (012) texture by about 30-60%. This surprising improvement can be explained by the combined effect of the (104) texture, Co-enrichment and enhanced bonding layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 1 shows a fracture cross-section SEM image of a typical coating according to the present invention (magnification 10,000×). The alumina layer is composed of columnar grains with (104) texture. The coating is dense with no detectable porosity.

DETAILED DESCRIPTION OF THE INVENTION

Substrate

According to the present invention a coated cutting tool insert is provided consisting of a cemented carbide body with a composition of 5-9 wt-%, preferably 6-8 wt-%, most preferably 6.0-7.0 wt-% Co, and 5-11, preferably 6.5-9.5, wt-% cubic carbides of the metals from groups IVb, Vb and VIb of the periodic table, preferably Ti, Nb and Ta, and balance WC. Preferably, the ratio between the weight concentrations of Ta and Nb is 1.0-3.0, preferably 1.5-2.5 and/or between the weight concentrations of Ti and Nb 0.5-1.5, preferably 0.8-1.2.

The cobalt binder phase is highly alloyed with tungsten. The concentration of W in the binder phase may be expressed as the S-value=$\sigma$/16.1, where $\sigma$ is the magnetic moment of the binder phase in $\mu Tm^3 kg^{-1}$. The S-value depends on the content of tungsten in the binder phase and increases with decreasing tungsten content. Thus, for pure cobalt, or a binder saturated with carbon, S=1 and for a binder phase containing tungsten in an amount corresponding to the borderline to formation of $\eta$-phase, S=0.78. The cemented carbide body has an S-value within the range about 0.79-0.90, preferably about 0.81-0.85. The mean grain size of the carbide phases may be expressed as the coercivity of the cemented carbide. A coercivity within about 9-16 kA/m, preferably about 10-15 kA/m, most preferably about 10-13 kA/m, gives improved cutting performance.

The cemented carbide body is provided with an about 5-40 μm thick, preferably about 10-30 μm thick, most preferably about 20-30 μm thick, essentially cubic carbide phase free and binder phase enriched surface zone with an average binder phase content in the range about 1.2-2.5 times the nominal binder phase content.

The invention also relates to methods of making cutting tool inserts according to the description comprising a cemented carbide substrate consisting of a binder phase of Co, WC and a cubic carbonitride phase with a binder phase enriched surface zone essentially free of cubic phase and a coating. A powder mixture containing about 5-9, preferably about 6-8 wt-%, most preferably about 6.0-7.0 wt-% Co, and about 5-11, preferably about 6.5-9.5, wt-% cubic carbides of the metals from groups IVb, Vb and VIb of the periodic table, preferably Ti, Nb and Ta, and balance WC is prepared. Preferably, the ratio between the weight concentrations of Ta and Nb is within about 1.0-3.0, preferably about 1.5-2.5 and/or between Ti and Nb within about 0.5-1.5, preferably about 0.8-1.2. Well-controlled amounts of nitrogen are added through the powder e.g. as nitrides or by performing an in-situ nitriding in the sintering furnace using e.g. nitrogen gas. The optimum amount of nitrogen to be added depends on the composition of the cemented carbide and in particular on the amount of cubic phases. The exact conditions depend to a certain extent on the design of the sintering equipment being used. It is within the purview of the skilled artisan to determine and to modify the nitrogen addition and the sintering process in accordance with the present specification in order to obtain the desired results.

The powder mixture is further mixed with pressing agent. Tungsten or carbon is added to obtain the desired S-value and the mixture is milled and spray dried to obtain a powder material with the desired properties. Next, the powder material is compacted and sintered. Sintering is performed at a temperature of about 1300-1500° C., in a controlled atmosphere of about 50 mbar followed by cooling.

Coating

The coating comprises at least one alpha alumina layer composed of columnar grains with a strong (104) texture. The columnar grains have a length/width ratio of from about 2 to 12, preferably 4 to 8. The thickness of the layer is from about 2 to 9 μm, preferably from about 5 to 7 μm.

The texture coefficients (TC) for the alumina layer are determined by X-ray diffraction analysis using CuKα radiation as follows:

$$TC(hkil) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=intensity of the (hkl) reflection
$I_O$(hkl)=standard intensity according to Joint Committee on Powder Diffraction Standards (JCPDS) card no 46-1212
n=number of reflections used in the calculation
(hkl) reflections used are: (012), (104), (110), (113), (116).
Note that the (024) reflection, which is a multiple of (012) is not used in calculations. Thus, compared with prior-art five reflections are used instead of six and the texture coefficients cannot be directly compared.

The texture of the alumina layer is defined as follows:
TC(104) is ≧about 2.0, preferably ≧about 3. Simultaneously TC(012), TC(110) and TC(113) are all <about 1.0, preferably <about 0.5. However, for this growth mode TC(116) is somewhat higher than the other background reflections. TC(116) should be less than about 1.2, preferably less than about 1 but preferably >about 0.5.

When the (104)-textured α-Al$_2$O$_3$ layer is the uppermost layer, the surface thereof is preferably wet-blasted to a surface roughness $R_a$ of <about 1.0 μm, preferably <about 0.7 μm.

The coating comprises a MTCVD Ti(C,N) as the first layer adjacent the body having a thickness of from about 2-10 μm, preferably from about 4-6 μm. Preferably, there is an intermediate layer of TiN between the substrate and said Ti(C,N) layer with a thickness of <about 3 μm, preferably about 0.5-2 μm. Preferably, there is an additional TiN layer in the Ti(C,N) layer having a thickness of about 0.5-3 μm, preferably about 1.0-2.0 μm located about 0.5-2.5 μm below the alumina layer. The first MTCVD Ti(C,N) layer adjacent the substrate can be substituted by CVD Ti(C,N), CVD TiN, CVD TiC, MTCVD Zr(C,N), MTCVD Ti(B,C,N), CVD HfN or combinations thereof.

Between the alumina layer and its closest underlying layer there is a (Ti,Al)(C,O,N) about 0.1-1 μm thick bonding layer preferably with an Al concentration gradient.

The present invention also relates to a refined method to produce textured α-Al$_2$O$_3$ layers in a temperature range of about 750-1000° C. with a (104) texture. To nucleate α-Al$_2$O$_3$ with the specified texture several steps are needed. First, a bonding layer is deposited (1). Nitrogen and CH$_3$CN are applied during deposition of this bonding layer. The surface of this bonding layer is subjected to an additional treatment(s).

Nucleation is started with a AlCl$_3$/TiCl$_4$/H$_2$ pulse (3) with a duration of about 5 minutes. After that an Ar purge (duration of about 5 minutes) is applied in order to remove excess Cl$^-$ from the surface (4). After this an oxidising pulse is applied using a CO$_2$/H$_2$/N$_2$/Ar (N$_2$=25%, Ar=balance) gas mixture. In addition to a relatively low oxidation potential of the gas mixture, the oxidising step has to be relatively short, about 0.5-5 minutes to secure (104) nucleation. These steps should be repeated several times, preferably about 2-5 times, in sequence to increase the amount of α-Al$_2$O$_3$ nuclei. It is noted that if pulsating nucleation is used, one has to find an optimised combination between the duration of the individual steps and the amount of the steps, otherwise too low or excessive oxidation may be obtained. A person skilled in the art can find the correct procedure by trial and error.

The key to obtain the specified growth texture is the control of the oxidation potential of the CO$_2$/H$_2$/N$_2$/Ar mixture by adjustment of the N$_2$:CO$_2$ ratio. This ratio should be about 450-650, preferably about 450-550. The use of controlled oxygen potential in combination with the correct time and number of pulses enables the correct nucleation mode. Typical pulse times may range from about 10 seconds to about 5 minutes depending on the duration of the pulse. The oxidising pulse is again followed by an Ar purge (6).

Detailed Description of the Nucleation Steps

1. Depositing a bonding layer 0.1-1 μm thick in a gas mixture of 2-3% $TiCl_4$, $AlCl_3$ increasing from 0.5 to 5%, 3-7% CO, 1-3% $CO_2$, 2-10% $N_2$ and balance $H_2$ at about 750-1000° C., preferably at 800° C. and at a pressure of 50-200 mbar.
2. Purging by Ar for 5 min.
3. Treating the bonding layer in a gas mixture of 1-2% $TiCl_4$ and 2-4% $AlCl_3$ in hydrogen for 2-60 min at 750-1000° C., preferably at 800° C. and at a pressure of 50-200 mbar.
4. Purging by Ar for 5 min.
5. Treating in a gas mixture of 0.05 to 0.1% $CO_2$ (preferably 0.05%), 20 to 65% $N_2$ (preferably 22.5-27.5% at $CO_2$=0.05%), 10% $H_2$, balance Ar.
6. Purging by Ar for 5 min.
7. Repeating steps 3-6 to obtain the optimum oxidation level.
8. Depositing an alpha alumina layer at a temperature of 950-1000° C. with desired thickness according to known technique or at 750-950° C. using higher deposition pressures (200-500 mbar) together with higher amounts (0.5-1.5%) of catalysing precursors such as $H_2S$ or $SO_x$, preferably $H_2S$.

In both cases the growth of the alumina layer onto the nucleation layer is started by sequencing the reactant gases in the following order: CO, $AlCl_3$, $CO_2$. The process temperatures of about 750 to 950° C. can be used since the texture is determined by the nucleation surface.

$Al_2O_3$ layers according to the present invention are especially suitable be used in toughness demanding stainless steel application such as interrupted turning, turning with coolant and especially intermittent turning with coolant. The other area is cast iron where the edge strength of this kind of alumina layer is superior to the prior art (012-texture).

It will be apparent to those skilled in the art that various modifications and variations can be made in the present invention and specific examples provided herein without departing from the spirit or scope of the invention. Thus, it is intended that the present invention cover the modifications and variations of this invention that come within the scope of any claims and their equivalents.

EXAMPLES

Example 1

Cemented carbide inserts of type CNMG120408-M3, WNMG080416 and SNUN120408 comprising 6.6 wt % Co, 3.4 wt % TaC, 2.2 wt % NbC, 2.9 wt % (Ti,W)C 50/50 (H.C. Starck) and balance WC, with a binder phase alloyed with W corresponding to an S-value of 0.83 was produced according to the invention. Inserts were produced by conventional milling of the raw material powders, pressing of the green compacts and subsequent sintering at 1430° C. The nitrogen was added to the carbide powder as Ti(C,N). The micro structural investigation after sintering showed that an essentially cubic carbide free surface zone with a thickness of about 20 μm was formed. The coercivity was about 12.1 kA/m corresponding to an average grain size of about 1 μm.

Example 2

Cemented carbide cutting inserts from Example 1 were coated with a layer of Ti(C,N) with MTCVD-technique, using acetonitrile as the carbon and nitrogen source for forming the layer at a temperature of 860° C. The thickness of the MTCVD layer was about 6 μm. On top of the MTCVD-layer a layer of 5-6 μm α-$Al_2O_3$ was deposited as follows:

a (104) textured α-$Al_2O_3$ layer deposited according to the present invention at 950° C. with detailed process data in Table 1, Coating a), or a (012) textured α-$Al_2O_3$ layer deposited according to prior art, Coating b).

TABLE 1

Deposition process for the $Al_2O_3$ layer of Coating a) with (104) texture at 950° C.:

| Step 1: Bonding layer | | |
|---|---|---|
| Gas mixture | $TiCl_4$ = | 2.8% |
| | $CH_3CN$ = | 0.7% |
| | $AlCl_3$ = | increasing from 0.8 to 4.2% |
| | CO = | 5.8% |
| | $CO_2$ = | 2.2% |
| | $N_2$ ... = | 5% |
| | Balance: | $H_2$ |
| Duration | 40 min | |
| Temperature | 800° C. | |
| Pressure | 100 mbar | |

| Step 2: Purge | | |
|---|---|---|
| Gas | Ar = | 100% |
| Duration | 5 min | |
| Temperature | 800° C. | |
| Pressure | 50 mbar | |

| Step 3: Pulse 1 | | |
|---|---|---|
| Gas mixture | $TiCl_4$ = | 1.6% |
| | $AlCl_3$ ... = | 2.8 |
| | $H_2$ = | Balance |
| Duration | 5 min. | |
| Temperature | 800° C. | |
| Pressure | 50 mbar | |

| Step 4: Purge | | |
|---|---|---|
| Gas | Ar = | 100% |
| Duration | 5 min | |
| Temperature | 800° C. | |
| Pressure | 50 mbar | |

| Step 5: Pulse 2 | | |
|---|---|---|
| Gas mixture | $CO_2$ = | 0.05% |
| | $N_2$ = | 25% |
| | $H_2$ ... = | 10% |
| | Balance: | Ar |
| Duration | 2 min | |
| Temperature | 800° C. | |
| Pressure | 100 mbar | |

| Step 6: Purge | | |
|---|---|---|
| Gas | Ar = | 100% |
| Duration | 5 min | |
| Temperature | 800° C. | |
| Pressure | 50 mbar | |

TABLE 1-continued

Deposition process for the $Al_2O_3$ layer of Coating a) with (104) texture at 950° C.:

Step 7: Nucleation step

| Gas mixture | $AlCl_3 =$ | 3.2% |
|---|---|---|
| | HCl... = | 2.0% |
| | $CO_2 =$ | 1.9% |
| | Balance | $H_2$ |
| Duration | 60 min | |
| Temperature | 800° C. | |
| Pressure | 50 mbar | |

Step 8: Deposition

| Gas mixture | $AlCl_3 =$ | 4.1% |
|---|---|---|
| | HCl... = | 1.0% |
| | $CO_2 =$ | 2.3% |
| | $H_2S =$ | 0.9% |
| | Balance: | $H_2$ |
| Duration | 320 min | |
| Temperature | 800° C. | |
| Pressure | 350 mbar | |

Steps 3-6 were repeated three times.

Example 3

The alumina layers in coatings a) and b) were studied using X-ray diffraction with CuKα-radiation. The texture coefficients were determined and are presented in Table 2. As clear from Table 3 the coating according to this invention exhibits a strong (104) texture when deposited either at 950° C. Typically, for this growth mode the (116) reflection is somewhat more pronounced than the other background reflections. The alumina layers were also studied in SEM. The alumina layers according to the invention exhibited a columnar morphology with a length/width ratio of 6, see FIG. 1.

TABLE 2

| hkl | Invention, Coating a) | Prior art, coating b) |
|---|---|---|
| 012 | 0.15 | 4.49 |
| 104 | 3.76 | 0.05 |
| 110 | 0.06 | 0.20 |
| 113 | 0.19 | 0.17 |
| 116 | 0.84 | 0.09 |

Example 4

The coatings a) and b) from the Example 2 were tested with respect to edge chipping in longitudinal turning of cast iron.

| Work piece: | Cylindrical bar |
|---|---|
| Material: | SS0130 |
| Insert type: | SNUN 120408 |
| Cutting speed: | 400 m/min |
| Feed: | 0.4 mm/rev |
| Depth of cut: | 2.5 mm |
| Remarks: | dry turning |

The inserts were inspected after 2 and 6 minutes of cutting. As is clear from Table 3 the edge toughness of the prior art product was considerably enhanced when the coating was produced according to this invention.

TABLE 3

| | Flaking of the edge line (%) after 2 minutes | Flaking of the edge line (%) after 6 minutes |
|---|---|---|
| Coating a (Invention) | 0 | 4 |
| Coating b | 12 | 22 |

Example 5

The coatings produced according to this invention were compared with a "Competitor X". This coating is composed of MTCVD Ti(C,N) and α-$Al_2O_3$. XRD was used to determine the texture coefficients for these competitor coatings. Two inserts from Competitor X were randomly chosen for XRD. Table 5 shows the obtained TCs for the insert according to the invention and for Competitor X. The coatings from Competitor X exhibited a quite random texture as compared with the present invention, Table 4.

TABLE 4

| Hkl | TC(hkl), invention | TC(hkl) competitor | |
|---|---|---|---|
| 012 | 0.19 | 1.52 | 1.50 |
| 104 | 3.79 | 0.92 | 0.94 |
| 110 | 0.06 | 1.07 | 1.12 |
| 113 | 0.12 | 0.47 | 0.33 |
| 116 | 0.84 | 1.02 | 1.11 |

Example 6

The X-rayed inserts from Competitor X were compared with inserts produced according to the present invention: The following data were used:

| Work piece: | Cylindrical tubes (Ball bearings) |
|---|---|
| Material: | SS2258 |
| Insert type: | WNMG080416 |
| Cutting speed: | 500 m/min |
| Feed: | 0.5 mm/rev |
| Depth of cut: | 1.0 mm |
| Remarks: | Dry turning |
| Tool life criterion: | Flank wear >0.3 mm with three edges of each variant tested. |
| Results: | Tool life (min) |
| Coating a | 19.0 (invention) |
| Coating a | 22.0 (invention) |
| Competitor X | 14.5 (prior art) |
| Competitor X | 10.5 (prior art) |

Example 7

The inserts produced according to the present invention were further compared in interrupted cutting with a "Competitor X" in a face turning operation. The following data were used:

| Work piece: | Cylindrical bar with drilled holes. |
|---|---|
| Material: | SS2258 |
| Insert type: | CNMG 120416-M3 |
| Cutting speed: | 200 m/min |
| Feed: | 0.4 mm/rev |
| Depth of cut: | 1.0 mm |
| Remarks: | Coolant |

The results expressed as number of facings are presented in Table 5.

TABLE 5

|  | Number of facings |
|---|---|
| Coating a (invention) | 130 |
| Competitor X | 70 |

Example 8

Coating a) and b) were tested with respect to toughness in longitudinal turning with interrupted cuts.

| | |
|---|---|
| Work piece: | Cylindrical slotted bar |
| Material: | SS1672 |
| Insert type: | CNMG120408-M3 |
| Cutting speed: | 140 m/min |
| Feed: | 0.1, 0.125, 0.16, 0.20, 0.25, 0.315, 0.4, 0.5, 0.63, 0.8 mm/rev gradually increased after 10 mm length of cut |
| Depth of cut: | 2.5 mm |
| Remarks: | dry turning |

Tool life criteria: Gradually increased feed until edge breakage. Ten edges of each variant were tested. The test results show (Table 6) that the coating according to the present invention (coating a) exhibits clearly better toughness behaviour than the prior-art (coating b).

TABLE 6

|  | Mean feed at breakage (mm/rev) |
|---|---|
| Coating a (invention) | 0.42 |
| Coating b (prior art) | 0.22 |

When ranges are used herein for physical properties, such as molecular weight, or chemical properties, such as chemical formulae, all combinations, and subcombinations of ranges specific embodiments therein are intended to be included.

The disclosures of each patent, patent application and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert comprising a cemented carbide body and a coating;
    wherein the cemented carbide body comprises:
    WC;
    about 5-9 wt-% Co; and
    about 5-11 wt-% cubic carbides of at least one metal selected from the group consisting of groups IVb, Vb and VIb of the periodic table;
    wherein the cemented carbide body has an S-value of about 0.79-0.9 and a coercivity of about 9-16 kA/m;
    wherein at least one surface of the cemented carbide body comprises a binder phase enriched surface zone having a thickness of about 5-40 μm and being essentially free from cubic carbides adjacent the coating;
    wherein the coating comprises at least one $\alpha$-$Al_2O_3$ layer, wherein the $\alpha$-$Al_2O_3$ layer is about 2-9 μm thick and wherein the $\alpha$-$Al_2O_3$ layer comprises columnar grains with a length/width ratio from about 2-12, whereby the $\alpha$-$Al_2O_3$ layer has a (104) texture and a texture coefficient TC(104)$\geq$2.0;
    where:
    the texture coefficient TC(hkil) is defined as:

$$TC(hkil) = \frac{I(hkil)}{I_0(hkil)} \left[ \frac{1}{n} \sum_{n=1}^{n} \frac{I(hkil)}{I_0(hkil)} \right]^{-1}$$

where:
I(hkil)=measured intensity of the (hkil) reflection;
$I_0$(hkil)=standard intensity according to JCPDS card no. 46-1212;
n=number of reflections used in the calculation where the (hkil) reflections used are: (012), (104), (110), (113) and (116).

2. The cutting tool insert of claim 1,
    wherein the cemented carbide body comprises 7.5-9.5 wt-% cubic carbides of at least one metal selected from the group consisting of groups IVb, Vb and VIb of the periodic table.

3. The cutting tool insert of claim 1,
    wherein the cemented carbide body comprises cubic carbides of at least one metal selected from the group consisting of Ti, Nb and Ta.

4. The cutting tool insert of claim 1,
    wherein the cemented carbide body has a coercivity of about 10-15 kA/m.

5. The cutting tool insert of claim 1,
    Wherein the binder phase enriched surface zone has a thickness of about 10-30 μm.

6. The cutting tool insert of claim 1,
    wherein the $\alpha$-$Al_2O_3$ layer has a texture coefficient TC (104)$\geq$about 3.

7. The cutting tool insert of claim 1,
    wherein TC(012), TC(110) and TC(113) are all <about 1.0.

8. The cutting tool insert of claim 1,
    wherein the coating comprises a first layer adjacent to the body;
    wherein the first layer of the coating comprises a material selected from the group consisting of CVD Ti(C,N), CVD TiN, CVD TiC, CVD Hf N, MTCVD Ti(C,N), MTCVD Ti(C,O,N), MTCVD Zr(C,N), MTCVD Zr(C,O,N), MTCVD Ti(B,C,N), MTCVD (Ti,Al)(C,O,N) and combinations thereof; and
    wherein the first layer of the coating has a thickness of from about 2-10 μm.

9. The cutting tool insert of claim 8,
    wherein the first layer comprises Ti(C,N).

10. The cutting tool insert of claim 1,
    wherein the $\alpha$-$Al_2O_3$ layer is the uppermost layer and has an $R_a$ value <about 1.0 μm.

11. The cutting tool insert of claim 1,
    wherein the $\alpha$-$Al_2O_3$ layer has an $R_a$ value <about 0.7 μm.

* * * * *